(12) United States Patent
Toth et al.

(10) Patent No.: US 6,927,383 B2
(45) Date of Patent: Aug. 9, 2005

(54) RADIATION HARDENED VISIBLE P-I-N DETECTOR

(75) Inventors: Andrew G. Toth, Oxnard, CA (US); Le T. Pham, Ventura, CA (US); Jerry R. Cripe, Lompoc, CA (US)

(73) Assignee: Raytheon Company, Waltham, MA (US)

( * ) Notice: Subject to any disclaimer, the term of this patent is extended or adjusted under 35 U.S.C. 154(b) by 141 days.

(21) Appl. No.: 10/207,422

(22) Filed: Jul. 26, 2002

(65) Prior Publication Data

US 2004/0016872 A1 Jan. 29, 2004

(51) Int. Cl.$^7$ ............................................. H01L 31/00
(52) U.S. Cl. .............................. 250/214.1; 250/214 LA
(58) Field of Search ....................... 250/214.1, 214 LA, 250/208.1, 239; 257/290, 291, 432, 433, 434

(56) References Cited

U.S. PATENT DOCUMENTS

| | | | |
|---|---|---|---|
| 5,600,130 A | * 2/1997 | VanZeghbroeck | 250/214.1 |
| 5,670,817 A | 9/1997 | Robinson | 257/443 |
| 5,798,558 A | 8/1998 | Tyson et al. | 257/458 |
| 5,923,071 A | 7/1999 | Saito | 257/458 |
| 2003/0075683 A1 | 4/2003 | Fujita et al. | 250/306 |

* cited by examiner

Primary Examiner—Que T. Le
(74) Attorney, Agent, or Firm—William C. Schubert; Karl A. Vick

(57) ABSTRACT

Disclosed is a method for producing an array (20) of p-intrinsic-n light detectors, as is an array produced in accordance with the method. The method includes providing a wafer (1); forming a first layer (2) having a first type of electrical conductivity (e.g., n-type) over a surface of the wafer; forming a second layer (3) that is an intrinsic layer on the first layer and, for each light detector, implanting or diffusing a region (9A) into a surface of the second layer that is opposite the surface on the first layer, the region (9A) having a second type of electrical conductivity (e.g., p-type). The method further includes forming an opening or aperture, referred to herein as a V-groove (6), through the second layer at least to the first layer; and electrically contacting with a first electrical contact (15, 9B, 13B) the first layer through the V-groove. The method further electrically contacts each of the regions with an associated one of a second electrical contact (13A), where the first and second electrical contacts are located on a same, non-radiation receiving surface of the array. In a preferred embodiment the steps of electrically contacting each comprise forming an Indium bump, and further comprise hybridizing the array with a readout integrated circuit (30). In the preferred embodiment forming the first layer over the surface of the wafer includes growing a doped epitaxial layer over the surface of the wafer, or it may include implanting the first layer into the surface of the wafer. Forming the second layer on the first layer includes growing an intrinsic epitaxial layer on the first layer to a thickness of, for example 10 microns. The wafer is thinned, either mechanically, or chemically, or by both processes.

20 Claims, 3 Drawing Sheets

RADIATION HARDENED VISIBLE P-I-N DETECTOR

TECHNICAL FIELD

These teachings relate generally to detectors of electromagnetic radiation and, more specifically, relate to the construction of p-intrinsic-n (P-I-N)junctions on silicon wafers.

BACKGROUND

Arrays of P-I-N junctions constructed on silicon wafers enable the implementation of high resolution digital imaging technology. The increasing demand for further improvements to digital imaging applications has resulted in the requirement to provide larger detector arrays containing more picture elements (pixels).

Existing methods for manufacture of visible light detector arrays on silicon wafers generally do not allow for the construction of arrays on wafers less than 125 microns thick. Attempts to produce such arrays have yielded assemblies that are too fragile to handle and are not useful in practical applications. In addition, an optimum bias voltage is in the range of about 30 volts, which is not easily achieved using existing readout circuit techniques.

Prior attempts to solve this problem have included the deposition of conventional PN junctions on complimentary metal oxide semiconductors (CMOS). However, this approach produces an array where each junction has a poor fill factor and a low quantum efficiency. Such problems can occur, among other factors, as a result of recombination effects on the backside of the array after a diamond point turning or some other wafer thinning operation. Additionally, PN junctions are unsuitable for some applications due to their characteristic high capacitance.

Efforts to construct P-I-N junctions on CMOS have been ineffective at least for the reason that the high annealing temperatures required to activate the P-I-N implants destroy the electronic circuitry.

One of the largest visible light imaging arrays currently available is 1.1 square inches on a 3 inch diameter silicon wafer. These arrays typically contain about 1,000 by 1,000 detectors, arranged on 27 micron centers, resulting in one million unit cells. The desire to improve imaging technology requires greater capacity than offered by existing arrays, and necessitates the development of larger arrays. The current three inch wafer size limits the array size.

Another problem experienced with current designs include a difficulty in meeting radiation hardness specifications. A further problem is related to a difficulty in producing fully depleted small unit cells, as it is difficult to deplete the region between the unit cells through thicker semiconductor material when the unit cells have small center-to-center spacings. Another problem relates to array flatness, and hence the ease at which the array can be hybridized with other circuitry, such as a readout integrated circuit (ROIC). In conventional practice one may have to rely on the initial flatness of the wafer, which can be subjected to warping and bowing during fabrication.

It is known to implant the front and back surfaces of a relatively thick Si wafer in order to form an array of P-I-N detectors. However, the resulting structure is thick, and may not meet radiation hardness specifications.

SUMMARY OF THE PREFERRED EMBODIMENTS

The foregoing and other problems are overcome, and other advantages are realized, in accordance with the presently preferred embodiments of these teachings.

This invention provides a method for the production of large capacity arrays of P-I-N detectors. A further aspect of this invention provides an array of P-I-N detectors in accordance with the construction method of this invention.

The use of the teachings of this invention provides for the development of large P-I-N detector arrays using, as examples, four inch to eight inch diameter wafers, where the unit cell size of each P-I-N detector may be as small as, for example, 8 microns to 12 microns, which is not readily achievable using current bulk substrates that employ 125 micron thick materials.

The arrays that are produced through the use of the method of this invention offer distinct advantages over prior designs. This is true at least for the reason that the P-I-N detectors are fully depleted at a lower voltage as compared to the prior art, as well as for the reason that this invention enables one to provide radiation hardened flat arrays that are large in comparison to arrays produced by conventional methods.

In accordance with the teachings of this invention, the foregoing and other advantages are realized by growing in sequence n-type doped and intrinsic epitaxial silicon layers on a silicon wafer that may be, in one embodiment, an approximately 550 micron thick, four inch diameter silicon wafer, and then implanting a p-type layer into the intrinsic layer. The silicon-substrate layer is then thinned by any suitable method, such as by diamond point turning, to the final desired thickness. The resulting epitaxial structure can be made very thin, and is capable of achieving a high degree of radiation hardness and the full depletion required of very small unit cells. The use of larger wafers, i.e., those larger than conventional three inch wafers, also provides for the manufacture of an array of larger size that still meets the flatness requirements for hybridization.

In a preferred embodiment, electrical contact is made to the buried backside n-type layer through a V-groove made from the front side, such as by using a wet chemical KOH etch to form the V-groove. Electrical connection is then made via an electrical contact, such as an Indium bump to the readout integrated circuit.

Disclosed is a method for producing an array of p-intrinsic-n light detector, as is an array produced in accordance with the method. The method includes providing a wafer; forming a first layer having a first type of electrical conductivity (e.g., n-type) over a surface of the wafer; forming a second layer that is an intrinsic layer on the first layer and, for each light detector, implanting or diffusing a region into a surface of the second layer that is opposite the surface on the first layer, the region having a second type of electrical conductivity (e.g., p-type). The method further includes forming an opening or aperture, referred to herein as a V-groove, through the second layer at least to the first layer; and electrically contacting with a first electrical contact the first layer through the V-groove. A diffused or implanted region of the first type of electrical conductivity is provided on sidewalls of the V-groove for increasing the contact area and decreasing the contact resistance. The method further electrically contacts each of the regions with an associated one of a second electrical contact, where the first and second electrical contacts are located on a same, non-radiation receiving surface of the array. In a preferred embodiment the steps of electrically contacting each comprise forming an Indium bump, and further comprise hybridizing the array with a readout integrated circuit. In the preferred embodiment forming the first layer over the surface of the wafer includes growing a doped epitaxial layer over the surface of the wafer, or it may include implanting the first layer into the surface of the wafer. Forming the second layer on the first layer includes growing an intrinsic epitaxial layer on the first layer to a thickness of, for example 10 microns. The wafer is thinned, either mechanically, or chemically, or by both processes.

In the preferred embodiment the first type of electrical conductivity is n-type and the second type of electrical conductivity is p-type.

An array of p-intrinsic-n light detectors includes a (thinned) substrate, a first layer having n-type electrical conductivity formed over a surface of the substrate, a second layer that is an intrinsic layer disposed on the first layer; for each light detector, a region implanted into a surface of the second layer that is opposite the surface on the first layer, the implanted region having p-type electrical conductivity and at least one opening, preferably a V-groove, through the second layer at least to the first layer and including a first electrical contact for electrically contacting the first layer through the opening. The substrate can be a thinned portion of a starting silicon wafer, such as a four inch or larger wafer. A dielectric layer is utilized to cover exposed portions of the array and can function as an antireflection coating. An electrically depleted region, preferably in he form of a grid, may be provided to surround individual unit cells of the array.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

Figure 1:
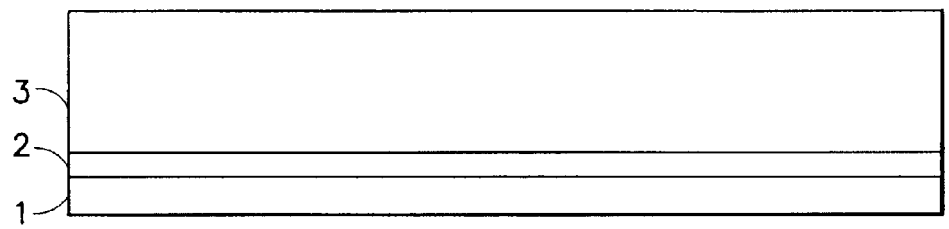
FIGS. 1–5 are enlarged cross-sectional views that are useful in describing a method for fabricating a P-I-N detector in accordance with the invention.
Figure 7:
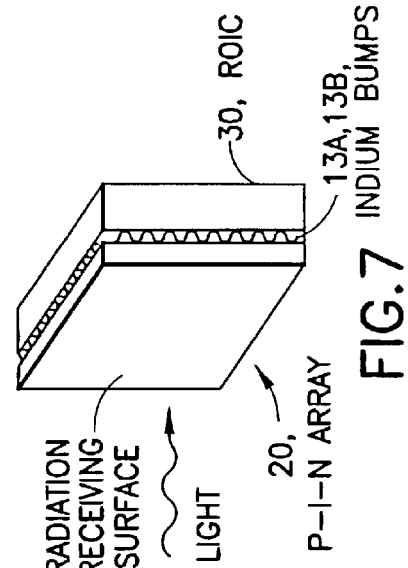
FIG. 7 shows an array of P-I-N detector unit cells hybridized with a readout integrated circuit (ROIC).

FIG. 1 illustrates the first steps in the process of producing the radiation hardened visible light P-I-N detector array 20, a portion of which is shown in completed form in FIG. 7. The assembly of the array of detectors begins with the selection of a p-type silicon wafer 1. In one non-limiting embodiment, the p-type silicon wafer 1 is approximately 550 microns thick and four inches, up to a maximum standard Si-based processing capability (currently 12 inches), in diameter. Conventional techniques are employed for growing an n-type doped epitaxial layer 2 upon the target side of the p-type silicon wafer 1. This n-type doped epitaxial layer 2 may be comprised of but is not limited to, Arsenic (As) as the dopant material. The n-type doped epitaxial layer 2 is grown to a thickness ranging from approximately 0.5 micron to approximately 10 micron.

In an alternate embodiment the layer 2 could be formed by an Arsenic or an Antimony (Sb) shallow, high concentration implant into the surface of the substrate 1. In an alternate embodiment the completed array could be thinned to the intrinsic epitaxial layer 3, described next, and the n-type layer 2 can then be formed by implanting As or Sb into the radiation receiving surface of the exposed intrinsic epitaxial layer 3.

For the purposes of this invention the thinning of the substrate/wafer can be accomplished by mechanically thinning (e.g., diamond point turning), by chemically thinning, or by a combination of mechanical and chemical procedures.

Subsequently the intrinsic epitaxial silicon layer 3 is grown over the n-type doped epitaxial layer 2 to a thickness of, for example, approximately 10 microns. There are a number of growth techniques that may be suitable for growth of the intrinsic epitaxial silicon layer 3. The selection of a particular growth technique is dependent upon various factors that include, but that need not be limited to, the noise performance of the detectors, the desired value for the index of refraction, and standard silicon epitaxial growth. In one embodiment, the intrinsic epitaxial silicon layer 3 is grown using a TCS gas at a temperature of approximately 1,120 degrees C. In another embodiment, the intrinsic epitaxial silicon layer 3 is grown using a $SiH_4$ gas at a temperature of approximately 1,020 degrees C. In a further embodiment, the growth of the intrinsic epitaxial silicon layer 3 commences with the use a $SiH_4$ gas at a temperature of approximately 1,020 degrees C., then switches to a TCS gas at a temperature of approximately 1,120 degrees C. Once the intrinsic epitaxial silicon layer 3 has been created, a first layer of $SiO_2$ 4 is grown (oxide #1).

Figure 2:
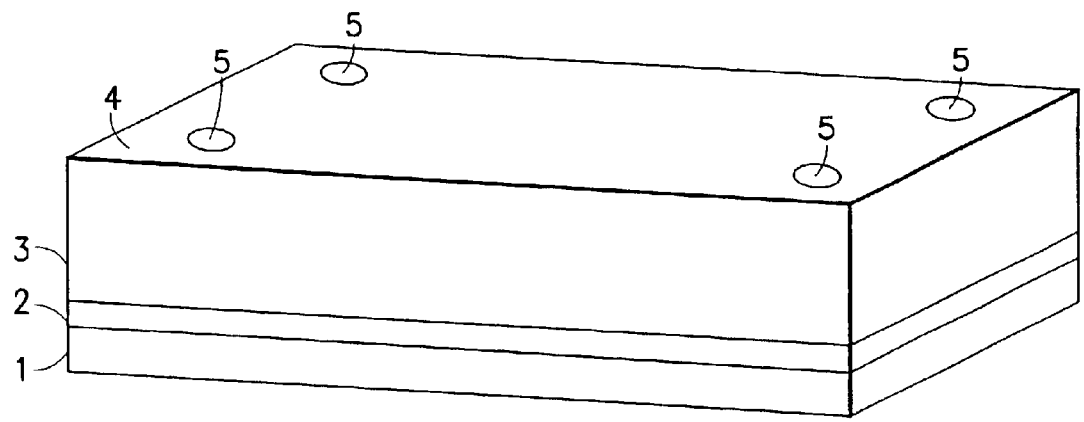

FIG. 2 shows the layer 4 of $SiO_2$ that is approximately 2000 Angstroms thick, and that is grown over the substantially thicker intrinsic epitaxial silicon layer 3. Alignment targets 5 are formed into the layer of $SiO_2$ 4 by, preferably, a Buffered Oxide Etch (BOE). The alignment targets 5 are formed in the $SiO_2$ layer 4 in preparation for the formation of V-grooves 6 that are a feature of the method and the array 20. Note that use of a V-shaped groove to form an electrical contact on an integrated circuit is known, but is employed in a novel manner in the practice of the teachings of this invention.

In another embodiment the $SiO_2$ layer 4 may be formed as a first (thicker) layer having a thickness of about 4000 Angstroms. The alignment targets 5 are then patterned totally within the first layer 4. A second layer of $SiO_2$ is then grown, and the locations of the V-grooves 6 are then aligned using the targets 5 in the thicker oxide layer.

As can be appreciated, a number of such processing variations can exist, depending in part on the capabilities and nature of the device fabrication equipment, on the size of the wafer, and on other related variables.

Figure 3:
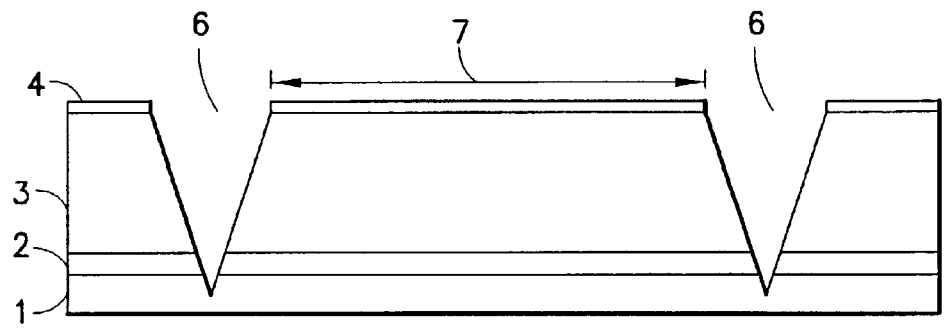

FIG. 3 depicts V-shaped openings or apertures, referred to herein as V-grooves 6, produced as a result of a wet chemical etch, preferably a KOH etch. The V-grooves 6 are formed through the intrinsic epitaxial silicon layer 3 at least to the n-type doped epitaxial layer 2 for making an ohmic contact with the n-type layer 2 on the backside of the unit cell 7. The ohmic contact is accomplished via an n-type implant, typically an As implant. The V-grooves 6 are formed in locations where it is desired to provide for ohmic contact, and do not necessarily appear between each unit cell 7. The V-grooves 6 are thus provided in order to implement a common array contact to the n-type epitaxial layer 2. The V-grooves 6 could extend through the n-type epitaxial layer 2 and into the Si substrate 1. Note that the V-shape of the grooves 6 can be a natural result of the chemical etching of the crystalline Si epitaxial layer 3.

Figure 4:
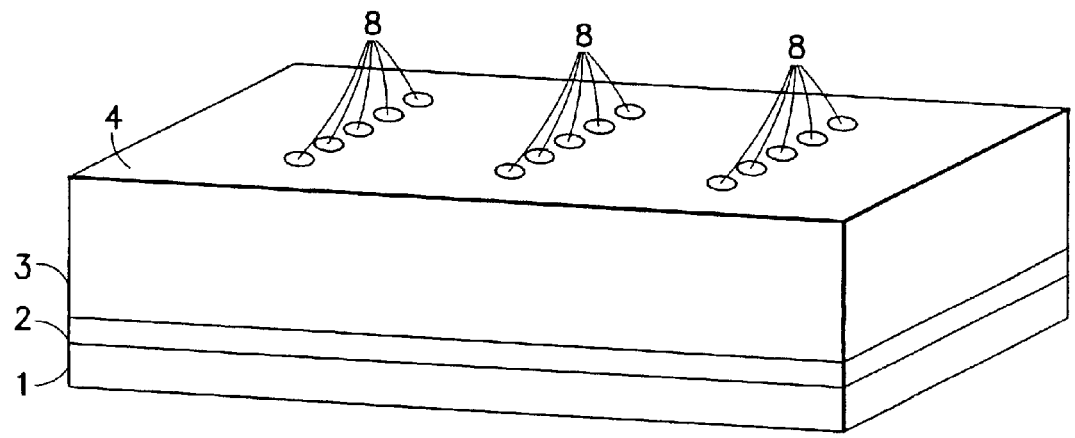
Figure 5:
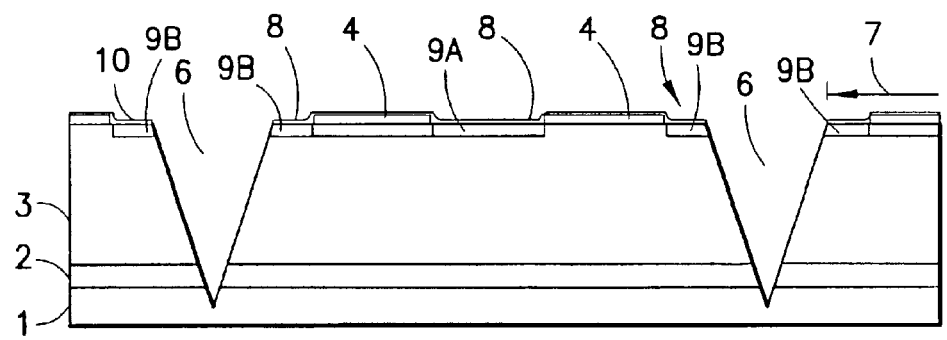

After the V-grooves 6 have been formed a portion of the $SiO_2$ 4 on each unit cell 7 is etched away with a Buffered Oxide Etch (BOE). FIG. 4 shows the diffusion area 8 of each unit cell 7 that is uncovered by the BOE etch. Once the diffusion area 8 has been exposed, and the V-grooves 6 covered by a mask, a p-type material, such as Boron (B) is implanted into the exposed intrinsic epitaxial silicon layer 3 as shown in FIG. 5, forming p+ implanted regions 9A. Next the mask is removed from around the edge of the V-grooves 6, the remainder of the surface is masked (including the p+ implanted regions 9A), and an n-type implant (e.g., As) is made to form n+ regions 9B. The annealing of the n+ implant 9B can be accomplished by a rapid thermal anneal (RTA) at, for example, 1100 degrees C. for 30 seconds, or an anneal used for the p+ implants 9A can be used as well for annealing the n+ implants 9B. The n-type implant region 9B preferably extends down the walls of the V-groove 6, and beneficially increases the electrical contact area between the n-type common epilayer 2 and subsequently applied metallization, thereby reducing contact resistance.

FIG. 5 shows the p-type regions 9A after the Boron is implanted into the exposed areas of the intrinsic epitaxial silicon layer 3, as well as the n-type regions 9B. Subsequent to the implanting of the p-type material regions 9A and the n-type regions 9B, a further layer of $SiO_2$ 10 (oxide #2) is grown over the assembly. This layer of $SiO_2$ 10 can be approximately 300 Angstroms thick, and provides for annealing of the implanted boron p-type material 9 (and possibly also the n-type regions 9B.

Once the annealing of the p-type regions 9A and the n-type regions 9B has been completed, a contact to the implanted p-type material 9A is opened by etching a window through the 300 Angstroms thick layer of $SiO_2$ 10.

It should be noted that either or both of the regions 9A and 9B could be formed by a diffusion process in a diffusion furnace, thereby possibly eliminating the need for the RTA. For example, the n+ regions 9B could still be formed by an ion implant, but the implant is performed prior to forming the p+ regions 9A. Then the p+ regions 9A are formed by a diffusion process and, in this case, the diffusion process may be adequate for also annealing the n+ implanted regions 9B.

Figure 6:
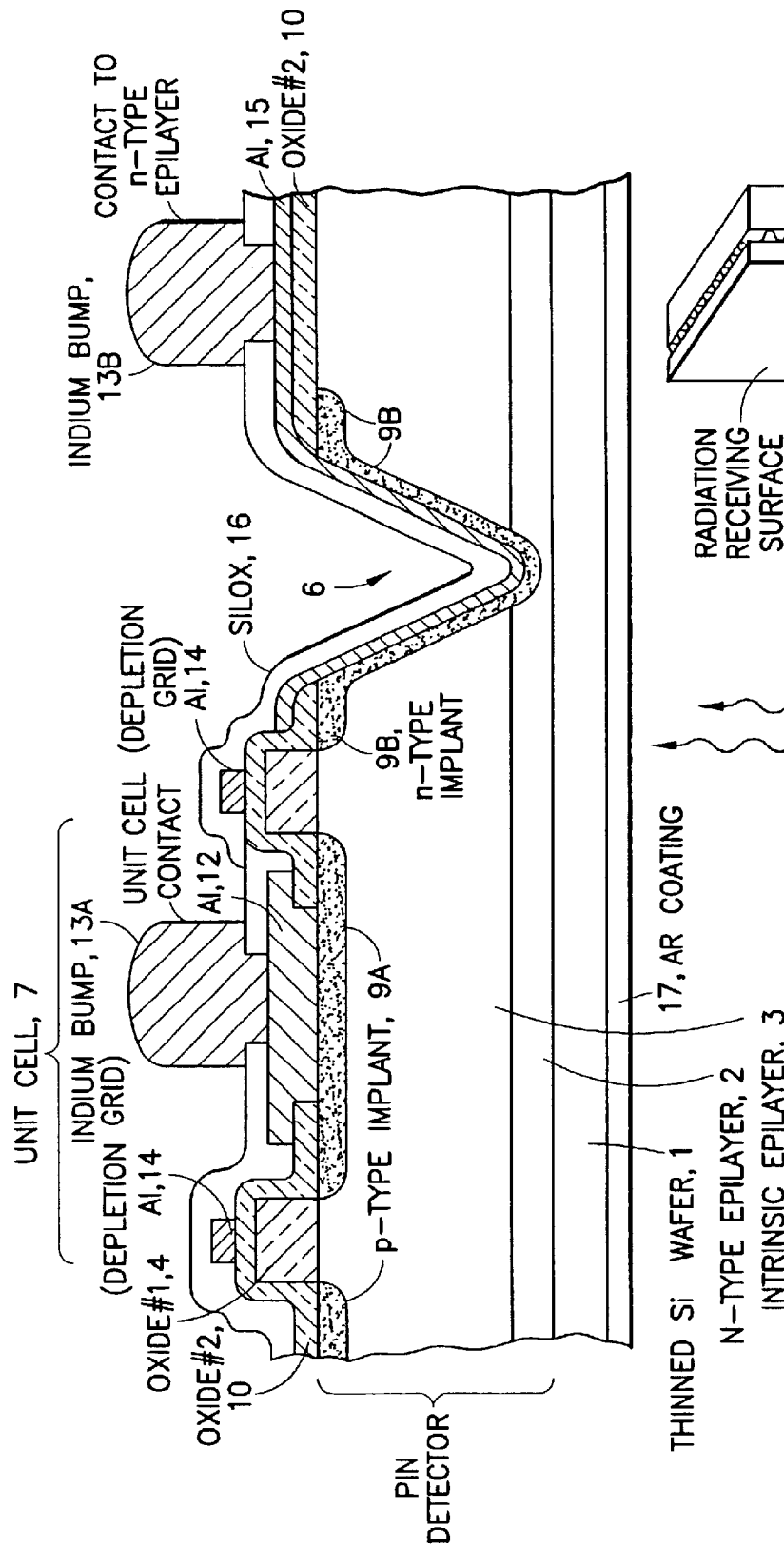
FIG. 6 is an enlarged cross-sectional view of a completed P-I-N detector unit cell in accordance with this invention.

Referring now to FIG. 6, a next step in the fabrication process deposits and etches a metal layer 12, such as Aluminum (Al), over the diffusion area of each unit cell for providing physical and electrical contact between a subsequently applied metal contact, preferably but not necessarily an Indium (In) bump 13, and the underlying p-type implant 9A and n-type implant 9B. It is also preferred at this time to delineate and fabricate a metal (Al) depletion grid 14 between the unit cells, thereby providing electrical isolation between unit cells and reducing cross-talk. Note that an Al contact 15 is made down the sidewalls of the V-groove 6 and over the n-type region 9B to electrically contact the n-type epilayer 2.

A next step deposits a dielectric overcoat 13, preferably Silox or another low temperature insulator process, and etches through the overcoat 13 to open windows to the Al layers 12 and 15, and any other areas that need access through the dielectric overcoat 13. Indium bumps 13 are then formed, shown as a first bump 13A for providing a discrete unit cell contact, and a second bump 13B (deposited at the same time) for providing a common contact the n-type epilayer 2. In a typical array 20 there will be a number of first bumps 13A equal to the number of pixels, and a lesser number of second bumps 13B for providing the common contacts to the n-type epilayer 2. While a single bump 13B, and V-trench 6, might provide the common contact, in a practical implementation it will be desirable to provide a number of common contacts that are distributed about the array 20 for reducing contact resistance and noise.

Further processing steps include dicing the Si wafer, hybridizing the array 20 with a ROIC 30, as shown in FIG. 7, and diamond point turning and/or mechanically/chemically (or vice versa) treating the radiation receiving surface of the array 20 for thinning the Si substrate 1. A suitable antireflection (AR) coating 17 can be applied if desired.

It can be appreciated that the teachings of this invention avoid a conventional requirement to implant the front and back surfaces of a relatively thick Si wafer, and instead forms a P-I-N junction by growing in sequence the n-type doped and intrinsic epitaxial Si layers over a Si substrate, such as an approximately 550 micron thick, four inch or larger Si wafer (a larger wafer will be thicker), and then implanting the p-type layer into the intrinsic layer. The Si wafer can then be thinned by any suitable process or processes to its final desired thickness. The resulting very thin (e.g., about 10 microns) epitaxial structure readily achieves radiation hardness specifications and enables a full depletion of the junction of small detector unit cells. The use of the larger wafer enables arrays of greater size to be fabricated such as, by example, an 8 k by 8 k array of unit cells (64 million pixels) arranged on 8 micron centers on a 2.6 square inch (66 mm) array. This contrasts very favorably to conventional 27 micron by 27 micron unit cells arranged on 27 micron centers in a 1 k by 1 k array.

The teachings of this invention also overcome the problems associated with the conventional use of a wirebond from the ROIC to the back surface of the hybridized array. Wirebonds are ineffective for this purpose, as the diamond point turning or other type of thinning operation will generally stop just short of the n-type epitaxial layer 2, and the backside junction will thus remain electrically isolated. To accommodate this configuration, electrical contact is made to the n-type epilayer 2 via the V-groove etch 6 made through the frontside of the array 20, followed by bumping to the ROIC 30.

The use of this invention also enables a 100% or near 100% fill factor to be achieved. Furthermore, diamond point turning of the Si wafer substrate does not cause deleterious electrical effects, since the n-type epitaxial layer in buried and not exposed as in a conventional n-type implant case. Furthermore, high temperature annealing is not required, thereby reducing the possibility of damaging the electronic circuits.

In addition, the teachings of this invention can provide a thinned P-I-N array having a total thickness of, for example, 20 microns maximum, and typically in the range of about 8 microns to 12 microns. Thinning of the array provides a number of advantages, not the least of which is an increase in the radiation hardness or the array. Note that the thinning operation can be performed at any suitable point in the fabrication process.

While described in the context of various presently preferred embodiments, those having to skill in the art should appreciate that various modifications and changes can be made to these embodiments without departing from the scope of this invention. For example, other types of contact metals can be used instead of Indium, such as solder balls and other contact systems. Furthermore, in another embodiment of this invention it may be desirable to reverse the ordering of the layers, such that the p-type layer is the buried layer over the substrate 1, and the n-type regions are implanted into the intrinsic layer 3 for defining the individual P-I-N detectors of the unit cells. In addition, the light detectors produced in accordance with the teachings of this what is claimed is:

1. A method for producing an array of p-intrinsic-n light detectors, comprising:
   providing a wafer;
   forming a first layer having a first type of electrical conductivity over a surface of the wafer;
   forming a second layer that is an intrinsic layer on the first layer;
   for each light detector, forming a first region into a surface of the second layer that is opposite the surface on the first layer, the formed first region having a second type of electrical conductivity; and
   thinning the wafer.

2. A method as in claim 1, and further comprising forming an opening through the second layer at least to the first layer; and electrically contacting with a first electrical contact the first layer through the opening.

3. A method as in claim 2, and further comprising electrically contacting each of the regions with an associated one of a second electrical contact, where the first and second electrical contacts are located on a same, non-radiation receiving surface of the array.

4. A method as in claim 3, where the steps of electrically contacting each comprise forming an Indium bump, and further comprising hybridizing the array with a readout integrated circuit.

5. A method as in claim 1, where forming the first layer over the surface of the wafer includes one of growing a doped epitaxial layer over the surface of the wafer and implanting the first layer into the surface of the wafer.

6. A method as in claim 2, where forming an opening through the second layer at least to the first layer includes forming a second region having the first type of electrical conductivity over sidewalls of the opening.

7. A method as in claim 6, where forming the first region and forming the second region comprise at least one of implanting a desired chemical species into the second layer and diffusing the desired chemical species into the second layer.

8. A method as in claim 1, where forming the second layer on the first layer includes growing an intrinsic epitaxial layer on the first layer.

9. A method as in claim 1, where thinning comprises at least one of mechanically thinning and chemically thinning the wafer.

10. A method as in claim 1, where the first type of electrical conductivity is n-type, and where the second type of electrical conductivity is p-type.

11. An array of p-intrinsic-n light detectors, comprising:
    a thinned substrate;
    a first layer having a first type of electrical conductivity disposed over a surface of the substrate;
    a second layer that is an intrinsic layer disposed on the first layer;
    for each light detector, a region formed into a surface of the second layer that is opposite the surface on the first layer, the formed region having a second type of electrical conductivity and forming a p-intrinsic-n detector with said underlying first layer via said second, intrinsic layer; and
    at least one opening made through the second layer at least to the first layer and a first electrical contact for electrically contacting the first layer through the opening.

12. An array as in claim 11, and further comprising, for each said region, an associated one of a second electrical contact, where the first and second electrical contacts are located on a same, non-radiation receiving surface of the array.

13. An array as in claim 12, and further comprising a readout integrated circuit hybridized with the array and electrically coupled to said array of p-intrinsic-n light detectors through the first and second electrical contacts.

14. An array as in claim 11, where said first layer comprises one of a doped epitaxial layer that is grown over the surface of said substrate and a layer that is implanted into the surface of said substrate.

15. An array as in claim 11, where said second layer comprises an intrinsic epitaxial layer that is grown on said first layer.

16. An array as in claim 11, where said substrate is comprised of a thinned portion of a silicon wafer.

17. An array as in claim 11, where the first type of electrical conductivity is n-type, and where the second type of electrical conductivity is p-type.

18. An array as in claim 11, and further comprising a dielectric layer that covers exposed portions of said array.

19. An array as in claim 11, and further comprising an electrically depleted grid that surrounds individual ones of the light detectors.

20. An array as in claim 11, where said first electrical contact comprises one of an implanted region in said intrinsic layer or a diffused region in said intrinsic layer having the first type of electrical conductivity.

* * * * *